March 13, 1962 J. H. FELKER 3,025,412

TRANSISTOR AMPLIFIER CIRCUITS

Filed June 17, 1954

INVENTOR
J. H. FELKER
BY [signature]
ATTORNEY

United States Patent Office 3,025,412
Patented Mar. 13, 1962

3,025,412
TRANSISTOR AMPLIFIER CIRCUITS

Jean H. Felker, Livingston, N.J., assignor to Bell Telephone Laboratories, Incorporated, New York, N.Y., a corporation of New York Filed June 17, 1954, Ser. No. 437,458
9 Claims. (Cl. 307—88.5)

This invention relates to electrical circuits and, more particularly, to transistor amplifier circuits.

Transisitor pulse amplifiers are often employed in electrical systems, such as synchronous digital computers wherein the logical operations are performed by germanium or other type diode circuits, to regenerate the positive information pulses in amplitude, time and shape. One such pulse amplifier is described in my Patent 2,670,-445, February 23, 1954, wherein feedback is attained through the base circuit of the transistor. In application Serial No. 372,897, filed August 7, 1953, of J. H. Vogelsong, now U.S. Patent 2,835,828, issued May 20, 1958, there is described a transistor pulse amplifier using regenerative feedback by employing feedback external to the transistor itself for the retiming of the pulses. The feedback voltage is applied, together with the input pulse, to a diode gate which applies a pulse to the emitter of the transistor under control of a timed clock pulse.

It is a general object of this invention to provide an improved transistor amplifier with external feedback.

It is a further object of this invention to increase the gain of a transistor amplifier.

It is another object of this invention to improve the margins of safety of a transistor pulse amplifier and to permit the use of transistors having a wider range of characteristics than priorly permissible.

With greater amplifier gain attainable by circuits in accordance with this invention, fewer amplifiers need be employed in a system or computer as more tandem logical operations can be performed between amplification of the information pulses. Additionally, the larger pulse amplitude and higher amplifier gain make available greater circuit margins with a resultant increase in reliability.

In circuits in accordance with this invention, the primary winding of an output transformer is connected to the collector of a transistor. The output transformer has two secondary windings, the first of these being a feedback winding and the other a load winding. A unidirectional current element or diode is connected to the feedback winding and gated so that during the build-up of the current through the transistor the feedback winding is connected to a low impedance but upon the feedback current reaching a predetermined value, the feedback winding is connected to a high impedance.

The ultimate feedback current in circuits in accordance with this invention is determined by the values of resistors and supply voltages in the amplifier circuit and is not a function of the transistor parameters or of the amplifier output voltage or current. Thus, once feedback has been established and the predetermined feedback current attained, the feedback current does not change with variations in the transistor collector voltage but remains constant until the end of the pulse.

Thus, in circuits in accordance with aspects of this invention, a gated feedback path is provided directly between the transistor collector and the emitter, the feedback current not being applied to a gate circuit to control the timing of the transistor but being instead applied to the emitter itself to attain increased gain due to positive feedback operation.

In specific embodiments of this invention current flows in the feedback secondary winding between input pulses and acts as magnetizing current for the transformer. This current ceases during the presence of the positive pulse of voltage on the collector of the transistor, and the flux is maintained by a current in the primary winding. The power furnished by the transistor during the pulse must, therefore, establish magnetizing current in the primary winding of the transformer which is equivalent to that which was flowing in the feedback secondary winding.

In one specific illustrative embodiment of this invention, transformer feedback through a diode gate is employed so that, as described above, the average current fed back during the pulse is controlled and is independent of the parameters of the transistors. In another specific embodiment this is combined with feedback through a pair of capacitors in the input or emitter circuit to improve the triggering of the transistor.

It is a feature of this invention that a transistor amplifier circuit include an output transformer having a primary winding connected to the collector of the transistor and a pair of secondary windings, one of the secondary windings being a feedback winding and the other a load winding.

It is another feature of this invention that the feedback path or loop include a unidirectional or asymmetric conducting element, such as a semiconductor diode, so that the feedback winding is connected to a low impedance during build-up of the feedback current but to a high impedance after the collector current has attained a predetermined value. Accordingly, it is a feature of this invention to employ gated feedback with a transformer feedback path including a second or feedback secondary winding of the output transformer.

It is a still further feature of this invention that the feedback current is applied directly to the emitter of the transistor itself, thereby attaining high gain.

It is a still further feature of this invention that current normally flows through the diode in the feedback path and through the feedback winding, the feedback current displacing this normal current flow in the feedback winding and forcing the displaced current to be applied directly to the emitter of the transistor.

It is a feature of one specific illustrative embodiment of this invention that gated transformer feedback be combined with feedback through capacitors in the input or emitter circuit.

A complete understanding of this invention and of these and other features thereof may be gained from consideration of the following detailed description and the accompanying drawing, in which.

Figure 1:
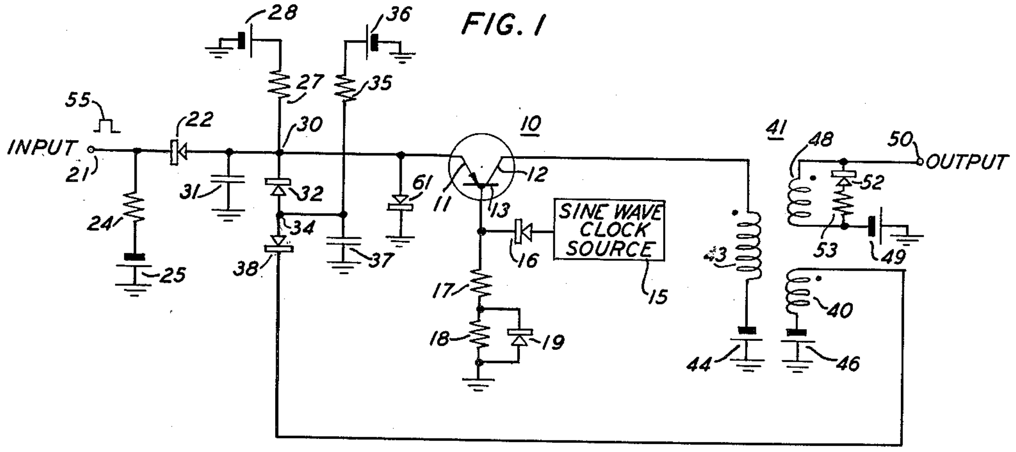
FIG. 1 is a schematic representation of one specific illustrative embodiment of the invention.

Turning now to the drawing, the specific illustrative embodiment of this invention depicted in FIG. 1 comprises a transistor 10 having an emitter 11, collector 12 and a base 13, the transistor being of the point contact type and having characteristics similar to that described in my Patent 2,670,445, February 23, 1954. In this embodiment the various bias polarities assume the transistor 10 to be of an n-type point contact transistor. A clock voltage, which is advantageously sinusoidal though other wave shapes may be employed, is applied to the base 13 from a clock source 15 through a diode 16. The base 13 is also connected to ground through a resistor 17 and the paralleled combination of the resistor 18 and the diode 19.

The emitter 11 is connected to the input terminal 21 through a diode 22. A resistor 24 connected to a source 25 of negative potential is advantageously connected to the input terminal 21. A resistor 27 connected to a source 28 of positive potential is connected to a point 30 between the emitter 11 and the diode 22. Also connected electrically to point 30 are a capacitor 31, the other plate of which is connected to ground, and a diode 32. The other side of the diode 32 is connected to a point 34 to which are also connected a resistor 35 biased by a source 36 of positive potential, a capacitor 37, the other plate of which is connected to ground, and a diode 38 which is also connected to the feedback winding 40 of the output transformer 41.

The output circuitry of a transistor amplifier in accordance with this embodiment of the invention comprises the output transformer 41 having a primary winding 43 connected to the collector 12 and to a source 44 of negative potential and a pair of secondary windings including a feedback winding 40 to which a small negative bias from a source 46 is applied, and a load secondary winding 48, one terminal of which is connected to a source 49 of negative potential and the other terminal of which is connected to the output terminal 50. A diode 52 and a resistor 53 may advantageously be connected across the load secondary winding 48 and serve to dissipate, in the intervals between input pulses, energy stored in the mutual inductance of the transformer and stray capacitance associated therewith.

Each of the diodes may advantageously be any of a number of unidirectional or asymmetrically conducting devices known in the art and may particularly comprise semi-conductor diodes such as silicon or germanium crystal diodes.

The operation of this specific embodiment of the invention may most readily be understood from a consideration of its operation under the two conditions of an input pulse not being applied to the input terminal 21 and with an input pulse applied to input terminal 21. With no input pulse applied, when the clock wave from the source 15 goes positive, the base 13 also goes positive. Of course, the transistor remains cut off. When the clock goes negative diode 16 is open and the transistor remains cut off because of the operation of the emitter circuit as described below. The current from source 36 and resistor 35 is chosen so that diodes 32 and 38 are conducting. The voltage on point 30 is therefore determined by source 46, the voltage on feedback winding 40, and the forward voltage drops of diodes 32 and 38.

Figure 2:
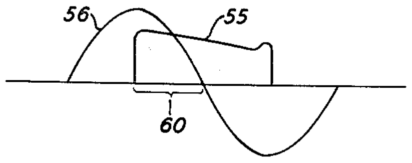
FIG. 2 is a time plot of one cycle of the clock voltage depicting the occurrence of the input pulse relative to the clock voltage.

An input pulse 55 is advantageously applied to the input terminal 21 while the clock wave from source 15 is still positive, the relationship being as depicted in FIG. 2 wherein the input pulse 55 and one cycle 56 of the clock wave are depicted, assuming the clock wave to be sinusoidal. When the input pulse 55 is applied, diode 22 is cut off and diode 32 is also cut off thereby interrupting the flow of current from sources 28 and 36 to source 25. Condenser 31, therefore, commences to charge due to the current flowing from source 28 to the point 30. Current from source 36 still flows through diode 38 to the feedback winding 40 but no longer flows back in the input circuit. The time constant for charging the condenser 31, which is determined by the capacitance of the condenser 31 and the value of the resistance 27, is advantageously such that it requires a time, depicted by the distance 60 on FIG. 2, or slightly less for the condenser to charge to a voltage such that the transistor can conduct, this voltage thus being the peak point or, as it is sometimes called, break point of the transistor. When the clock wave starts to go negative, the emitter 11 can begin to draw current from source 28 and from the condenser 31. Transistor 10 advantageously has sufficient current gain and frequency response to commence a free oscillation in which the emitter voltage goes more negative and the transistor begins to put current through the base circuit. When the emitter starts to draw current from the source 28 and condenser 31, point 30 is more positive than point 34 so that the diode 32 is cut off. However, as the emitter moves negative and current is drawn through the base circuit, point 30 becomes more negative than point 34 and diode 32 can again conduct.

Due to the start of this free oscillation in the transistor, the collector 12 goes positive. The problem now is to keep the transistor locked in its high conduction state. In accordance with this invention, this is assured by blocking the diode 38 so that current from the source 36 can only go through the now open diode 32 to the emitter 11. Specifically, in accordance with an aspect of this invention, this is attained by employing a secondary winding on the output transformer 41 and specifically a feedback winding 40. As current begins to flow in the primary winding 43 of the output transformer 41, we can consider that a current is induced in the output winding 40 from this pulse which replaces the current priorly flowing through the feedback winding from the source 36, diode 38 is back biased, thereby preventing current from the source 36 flowing in the feedback winding.

In the embodiment of FIG. 1 a diode 61 may be connected between the emitter 11 and ground to assure the prevention of premature triggering. If the particular transistor 10 employed in the circuit is especially easy to trigger, it is possible to have a pile-up of tolerances of element values such that condenser 31 charges positiveward very rapidly when an input pulse is applied. The transistor may then trigger when the clock wave 56, seen in FIG. 2, is at a voltage of about 2 volts and going negativeward so that the transistor starts its oscillation and emitter 11 takes current from condenser 31 even though the base 13 of the transistor is still held positive with respect to ground by the clock voltage applied thereto through diode 16. When this happens the voltage of point 30 becomes more negative and, because the base 13 is held positive, emitter 11 cannot draw current through diode 32. The transistor therefore returns to its low-current state.

When a diode 61 is employed the positive excursion of voltage of point 30 is limited and triggering cannot occur until the proper time, namely when the clock wave 56, seen in FIG. 2, reaches approximately ground potential. However, premature triggering as described above depends upon the particular transistor employed in the circuit and the pileup of tolerances of values of the various circuit elements. Thus while diode 61 may be employed to assure that premature triggering does not occur, it may not be necessary and may be omitted in various embodiments.

Figure 3:
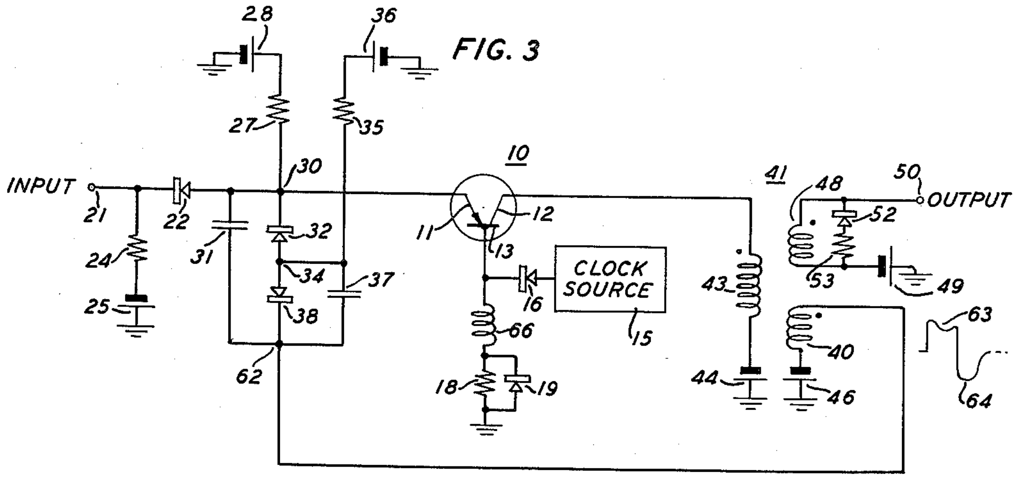
FIG. 3 is a schematic representation of another specific illustrative embodiment of the invention.

In the specific embodiment of this invention depicted in FIG. 3, the capacitors 31 and 37 are not connected to ground as in the embodiment of FIG. 1 but to the point 62 of the connection between the diode 38 and the feedback winding 40. The pulse 63 induced in the feedback winding 40 has an overshoot portion 64 following cessation of the pulse at the collector 12. This overshoot portion 64 causes the points 62, 34 and 30 to go negative immediately following cessation of conduction through the transistor, thus preventing condensers 31 and 37 from charging sufficiently positive. However, by connecting the previously grounded plates of capacitors 31 and 37 to the point 62 then during this negative overshoot of the pulse 63 these plates also go negative along with points 30 and 34 and, therefore, there is no delay in the charging of the capacitors and the frequency response of the circuit is improved. In this embodiment of the invention, the feedback from a second secondary winding on the output transformer 41 serves not only to lock the transistor in its high conduction state during operation of the transistor but also serves to charge the capacity due to both the condensers 31 and 37 and to aid in the triggering of the circuit.

In the embodiment of FIG. 3 the base resistance 17 has been replaced by an inductance 66. This permits improved control of the peak point of the transistor characteristic. While the impedance in the base is needed initially to trigger the transistor, employing an inductance decreases the power consumption in the base circuit.

In one specific illustrative embodiment of this circuit as depicted in FIG. 1 wherein in a point contact transistor and germanium diodes were employed, the various circuit parameters were as follows:

| | | |
|---|---|---|
| Resistor: | | |
| 17 | ohms | 470 |
| 18 | do | 2000 |
| 24 | do | 12000 |
| 27 | do | 22000 |
| 35 | do | 2700 |
| 53 | do | 2000 |
| Source: | | |
| 25 | volts | −8 |
| 28 | do | 6 |
| 36 | do | 6 |
| 44 | do | −8 |
| 46 | do | −2 |
| 49 | do | −2 |
| Condenser: | | |
| 31 | micromicrofarads | 15 |
| 37 | do | 300 |

The clock wave source 15 provided pulses 56 of 8 volts R.M.S. at a frequency of 1 megacycle. The total emitter current, with the diode 38 in the feedback path cut-off, was 3.5 milliamperes, and pulse gains of 8.5 db were realized.

Reference is made to applications Serial No. 437,457, filed June 17, 1954, of Q. W. Simkins, now U.S. Patent 2,802,118, issued August 6, 1957, and Serial No. 437,401, filed June 17, 1954, of J. H. Vogelsong, now U.S. Patent 3,011,066, issued November 28, 1961, wherein related inventions are disclosed.

It is to be understood that the above described arrangements are illustrative of the application of the principles of the invention. Numerous other arrangements may be devised by those skilled in the art without departing from the spirit and scope of the invention.

What is claimed is:

1. An amplifier circuit comprising a transistor, means for applying an input to said transistor, output means coupled to said transistor and gated feedback means coupling said input and output means, said gated feedback means including diode voltage responsive gating means initially linearly controlling the impedance of said feedback circuit in a low impedance range and, after a predetermined voltage is reached, controlling said impedance in a high impedance range, said feedback means also including constant current means for holding the feedback current constant when said predetermined voltage is reached.

2. An amplifier circuit comprising a transistor, including a collector, a base, and an emitter, input means connected to said emitter including a voltage divider circuit for normally applying a fixed potential to said emitter, output means connected to said collector, means including a gated feedback circuit coupled to said output means and said voltage divider and adapted to control the voltage applied to said input circuit in response to the voltage of said feedback, said feedback circuit comprising a voltage responsive gate adapted to present a high impedance to feedback current when the feedback voltage increases to a predetermined magnitude.

3. A transistor circuit comprising a transistor having at least emitter, collector and base elements, said transistor being characterized by having a low conduction state and a high conduction state, a collector circuit for said transistor comprising a source of collector operating potential and an inductive element in series with said source and said collector, an emitter circuit for said transistor, means responsive to the occurrence of a voltage pulse developed across said inductive element for maintaining the current through said emitter at the high conduction level at least during a portion of said pulse, and a resistive element arranged in the path of principal emitter current flow during said pulse for determining the magnitude of said flow.

4. A circuit in accordance with claim 3, in which said means comprises a source of bias connected to said emitter and sufficient to maintain said emitter in the high conduction condition, apparatus for normally overcoming said bias and itself responsive to a voltage applied thereto to be rendered inoperative, and means for applying at least a portion of said pulse developed across said inductive element to said apparatus to render it inoperative.

5. A circuit in accordance with claim 3, in which the value of said resistive element exceeds the internal emitter-to-base resistance of said transistor by at least an order of magnitude.

6. A circuit in accordance with claim 3, in which said emitter circuit includes means for biasing said emitter element substantially at collector-current cut-off.

7. A transistor wave-form generating circuit, comprising a transistor having at least emitter, collector, and base elements; a collector circuit for said transistor, including a source of collector potential and an inductive element in series between said collector element and said base element, and responsive to the occurrence of saturation in said transistor to produce a pulse of voltage across, and an increasing current through, said inductive element; means for feeding back regeneratively to said emitter element signals produced in said collector circuit in sufficient magnitude to maintain said saturation condition for a substantial time interval as said current through said inductive element increases and resistive means in series with the path of principal emitter current flow during said interval, for determining the magnitude of said emitter current and hence the time required for said current through said inductive element to reach the desaturation level of collector current.

8. An amplifier circuit comprising a transistor having an emitter and base and a collector and external feedback circuit for applying feedback current directly to the emitter, said feedback circuit including a transformer having its primary winding connected to said collector and a first secondary winding connected to said emitter, gating means in said feedback circuit between said first secondary winding and said emitter, said gating means including an asymmetrically conducting device, and means biasing said device to present a low impedance to said first secondary winding during the initial buildup of current in said transistor and to present a high impedance to said first secondary winding after said current has reached a predetermined value, and an output circuit connected to a secondary winding of said transformer.

9. An amplifier circuit as claimed in claim 8 further including means for applying an input pulse to said emitter, and means for applying a clock voltage wave to said transistor to time the commencement of conduction through said transistor on application of said input pulse.

References Cited in the file of this patent

UNITED STATES PATENTS

| | | |
|---|---|---|
| 2,390,502 | Atkins | Dec. 11, 1945 |
| 2,419,052 | Becker | Apr. 15, 1947 |
| 2,556,286 | Meacham | June 12, 1951 |
| 2,627,039 | Williams | Jan. 27, 1953 |
| 2,644,893 | Gehman | July 7, 1953 |
| 2,673,936 | Harris | Mar. 30, 1954 |
| 2,706,247 | Jacobs et al. | Apr. 12, 1955 |
| 2,756,329 | Lubkin | July 24, 1956 |
| 2,758,205 | Lubkin | Aug. 7, 1956 |
| 2,757,243 | Thomas | July 31, 1956 |